United States Patent [19]

Quastel et al.

[11] Patent Number: 4,901,008
[45] Date of Patent: Feb. 13, 1990

[54] CIRCUIT ARRANGEMENT FOR TESTING THE CORRECT FUNCTIONING OF CIRCUIT(S)

[75] Inventors: David A. Quastel, Melksham; Nigel K. Hill, Chippenham, both of Great Britain

[73] Assignee: Westinghouse Brake & Signal Company Ltd., Pew Hill, Great Britain

[21] Appl. No.: 252,246

[22] Filed: Sep. 29, 1988

[30] Foreign Application Priority Data

Oct. 14, 1987 [GB] United Kingdom ............... 8724087

[51] Int. Cl.⁴ .................. G01R 33/06; G01R 21/08
[52] U.S. Cl. ....................... 324/117 H; 324/117 R; 324/251; 324/252; 338/32 H
[58] Field of Search ............ 324/117 R, 117 H, 127, 324/251, 252, 253, 234, 235; 338/32 H; 364/483; 307/309

[56] References Cited

U.S. PATENT DOCUMENTS 3,518,459  6/1970  Green .................................. 324/252
4,692,703  9/1987  Extance et al. ..................... 324/251
4,742,296  5/1988  Petr et al. .......................... 324/117 R

OTHER PUBLICATIONS

Kulesho; "Measuring Low Voltage in a D.C. Circuit"; Instruments and Experimental Techniques; vol. 19, No. 2, Pt. 2, pp. 562–563; Mar.–Apr. 1976.

Primary Examiner—Reinhard J. Eisenzopf
Assistant Examiner—Vinh P. Nguyen
Attorney, Agent, or Firm—Nilsson, Robbins, Dalgarn, Berliner, Carson & Wurst

[57] ABSTRACT

There is disclosed a circuit arrangement including a load (7) and a current source (1) for supplying current to the load via a current path with a winding (3). A core of magnetizable material (2) is coupled inductively with the winding and a Hall effect transducer (4) detects magnetic flux in the core for use in producing an output indication dependant on the magnitude of the load current. For testing the correct functioning of circuit(s), the circuit arrangement is further provided with an additional winding (6) on the magnetizable core, through which a further current source supply a further current, in which the core is also inductively coupled so that the transducer also detects flux in the core due to the further current.

5 Claims, 3 Drawing Sheets

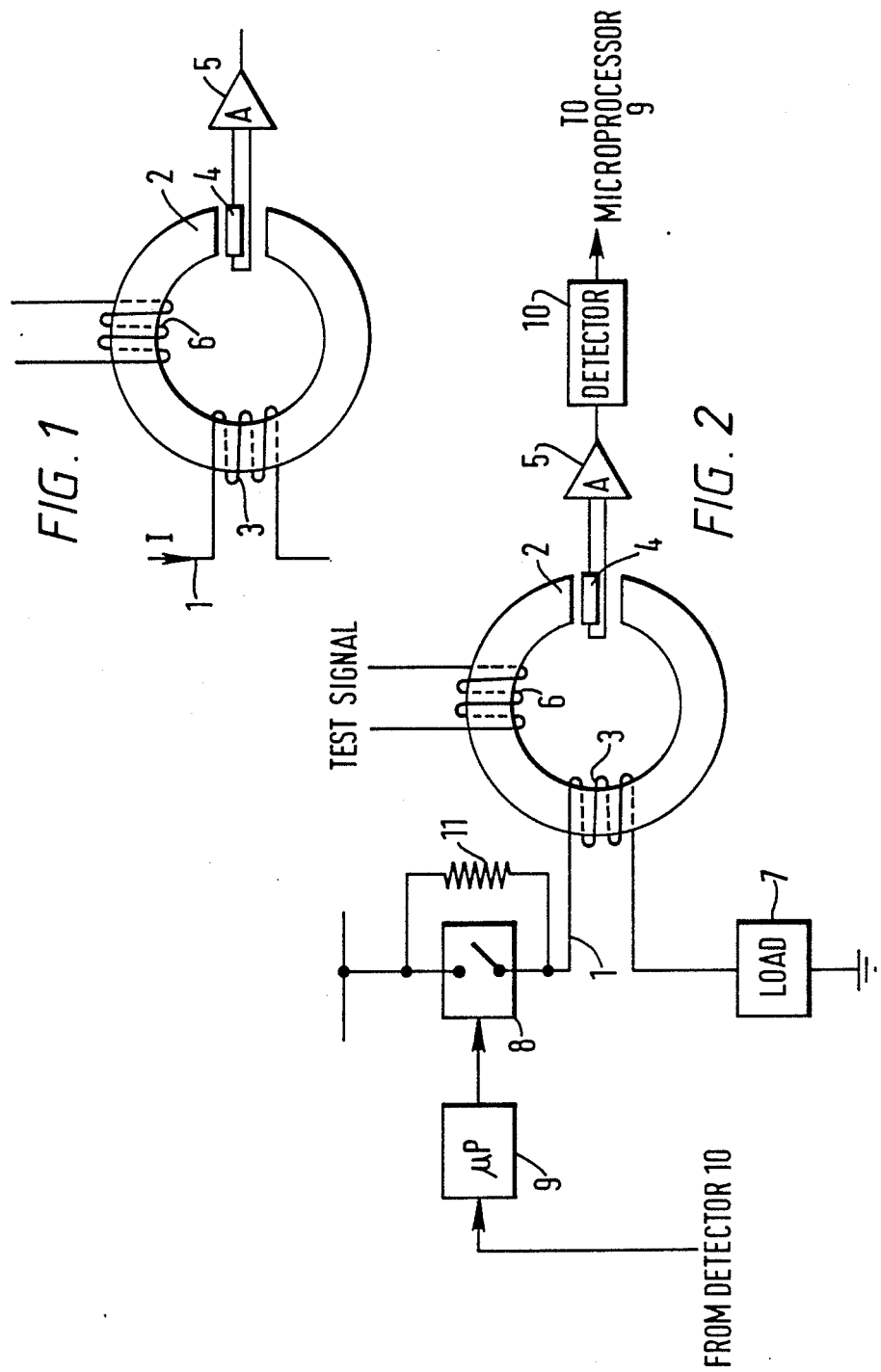

CIRCUIT ARRANGEMENT FOR TESTING THE CORRECT FUNCTIONING OF CIRCUIT(S)

The present invention relates to testing a circuit arrangement, for example a circuit arrangement in a railway signalling system whose correct operation is vital to the safety of the system.

According to the present invention, there is provided a circuit arrangement comprising:
(a) a load;
(b) supply means for supplying current to the load via a current path;
(c) magnetic circuit means which is coupled inductively with the said current path;
(d) magnetic flux detecting means for detecting magnetic flux in the magnetic circuit means, for use in producing an output indication dependent on the said current; and
(e) testing means, comprising further supply means for supplying a further current via a further current path, the magnetic circuit means also being coupled inductively with the further current path so that the detecting means also detects magnetic flux in the magnetic circuit means due to the further current.

The present invention will now be described, by way of example, with reference to the accompanying drawings, in which:

FIG. 1 is a diagram for use in explaining the operation of embodiments of the invention;

FIG. 2 is a diagram of a basic embodiment of the invention;

Figure 3:
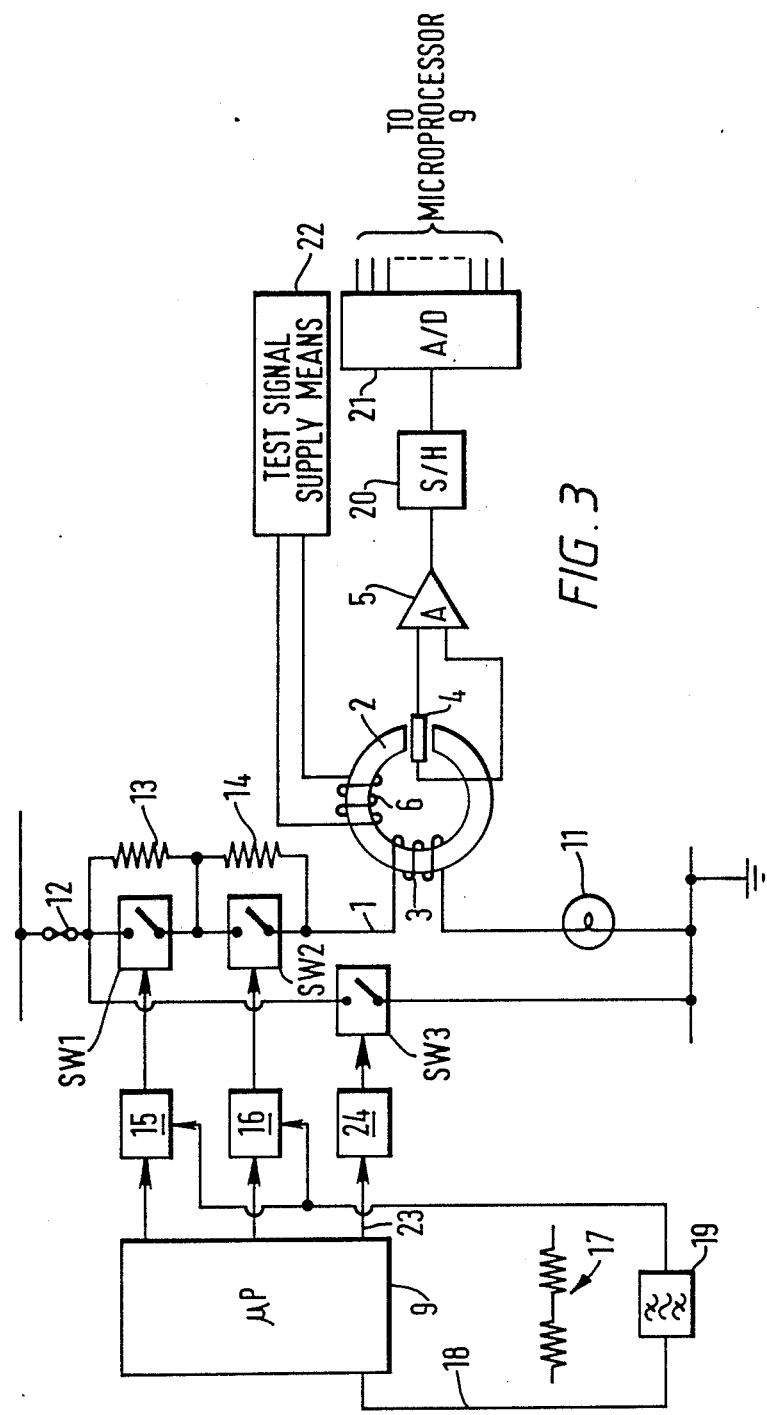
FIG. 3 is a diagram of another embodiment of the invention.

Referring to FIG. 1, a current I through a conductor 1 is passed through a load (not shown). A known form of detection means for detecting the current I comprises a core 2 of magnetisable material in the shape of a toroid and defining a magnetic circuit, the conductor 1 being wound as a winding 3 on the core 2, there being in a gap in the latter a linear output Hall effect transducer 4 whose output is coupled to an amplifier 5. Current I produces a flux in the magnetic circuit formed by the core 2, the magnitude of which is proportional to the magnitude of the current I The transducer 4 produces an electrical signal proportional to the magnitude of flux passing through it, which signal is thus proportional to the current I. The amplifier 5 then increases the amplitude of this signal to produce an indication of the magnitude of the current I.

In a non-safety critical environment, such an arrangement is acceptable. If, however, the current measurement is vital for safety purposes, then it is unacceptable for the following reasons
(1) The winding 3 may be short-circuited, thus giving a zero measurement when a current is actually flowing.
(2) The winding 3 may develop a shorted turn, resulting in less flux being produced and thus giving a measurement of less current than is actually flowing
(3) The core 2 may fracture, increasing the reluctance and decreasing the flux. This would result in a measurement of less current than is actually flowing.
(4) The transducer 4 may move out of the gap and consequently out of the flux path. This would result in a measurement of less current than is actually flowing.
(5) The characteristics of the transducer 4 may change and result in an increased or decreased measurement.
(6) The gain of the amplifier 5 may alter and result in an increased or decreased measurement.

At least some of the above shortcomings may be overcome by adding a further winding 6 on to the core 2, the winding 6 carrying a "test" current for testing the circuit arrangement comprising conductor 1, winding 3, core 2, transducer 4 and amplifier 5—it will be known if there is a fault in this circuit arrangement if the output of amplifier 5 is not what would be expected from the test current.

FIG. 2 is a diagram of an embodiment using such a further winding, items in FIG. 2 which correspond with items in FIG. 1 having been given the same reference numerals as in FIG. 1. In FIG. 2, direct current I in conductor 1 is passed through a load 7 by closing a switch 8 under the control of a microprocessor 9, the switch 8, the winding 3 and the load 7 being connected in series across a voltage supply. The output of the amplifier 5 is connected to a detector 10 whose output is connected to the microprocessor 9. A low resistance proof resistor 11 is connected across the switch 8. A direct test current of known magnitude is passed through the winding 6, so that the output signal of the detector 10 will be of a known, expected magnitude if there is no fault as regards the core 2, the transducer 4, the amplifier 5 and the detector 10, but not of this magnitude if there is such a fault. The circuit arrangement of FIG. 2 guards against the above shortcomings in the following manner:

(1) The microprocessor 9 expects an output signal from the detector 10 that corresponds to the state of the switch 8. If there is a zero output even though switch 8 is closed, then the microprocessor detects that there is a fault.

(2) If a shorted turn should occur in winding 3, then the current flowing via the low resistance proof resistor 11 when the switch 8 is open will be below the expected magnitude. The low resistance proof resistor 11 cannot reduce in resistance to compensate for the shorted turn.

(3) Should the core 2 fracture, then the reluctance will increase and flux will decrease, resulting in a response of less than the expected magnitude.

(4) Also, core fracture can be detected by virtue of a lower output signal from the detector 10 than expected as a result of the test current and this can be detected by the microprocessor 9. Similarly, if there is a positional fault in the transducer 4, a change in the latter's characteristics, a change in the characteristics of the amplifier 5 or a fault in the detector 10, the output signal from the latter resulting from the test current will not be as expected and this can be detected by the microprocessor 9.

Referring to FIG. 3, this is a diagram of an arrangement for controlling the energisation of a load which is the filament of a lamp, which could, for example, be a railway signalling lamp. In a railway signalling environment, it is, of course, essential that the filament of a signalling lamp only be energised when it should be and it must also be known if the filament is not being energised to the correct amount when it should be. In FIG. 3, items which are the same as items in FIG. 2 have been given the same reference numerals as in FIG. 2. The arrangement of FIG. 3 allows for the measurement of the current flowing in the filament and also allows for the testing of the measurement function without affecting the filament current magnitude. The filament of the lamp (11) is connected in series with a pair of switches SW1 and SW2 and a fuse 12 across a voltage supply. Connected in parallel across switch SW1 is a low resistance proof resistor 13 and connected in parallel across switch SW2 is a low resistance proof resistor 14. The opening and closing of switches SW1 and SW2 is effected under the control of the microprocessor 9 via respective enabling circuits 15 and 16. Each of circuits 15 and 16 comprises an opto-isolator and an AND gate. The microprocessor 9 carries out self-checking routines and if it is deemed to be operating correctly, then a dynamic signal 17 occurs on a line 18 as a "health signal". The signal 17 is passed through a band-pass filter 19 (designed to fail to safety, i.e. produce no output, if it becomes faulty) whose output signal is an enabling input for the AND gates of circuits 15 and 16. The function of the detector 10 in FIG. 2 is achieved by a sample and hold circuit 20 whose output feeds an analogue to digital converter 21, the output of the latter being connected to the microprocessor 9. If each of switches SW1 and SW2 is open, then a low current flows through the winding 3 and the filament of the lamp 11, but not enough to cause illumination of the latter, by virtue of resistors 13 and 14. If one of the switches SW1 and SW2 closes when it should be open, then twice the low value of current will occur and this will be detected by the circuitry comprising the winding 3, core 2, transducer 4, amplifier 5, sample and hold circuit 20 and converter 21 and the microprocessor 9 will accordingly detect a fault. The reason why there are two switches (SW1 and SW2) in series with the filament of the lamp 11 is that if one of them *does* fail to a closed, then the other switch should still be open, for safety purposes.

For testing the circuitry comprising the core 2, the transducer 4, the amplifier 5, the sample and hold circuit 20 and the converter 21, the additional winding 6 is provided, functioning as in FIG. 2 by receiving an appropriate direct test current (supplied via supply means 22).

Figure 4:
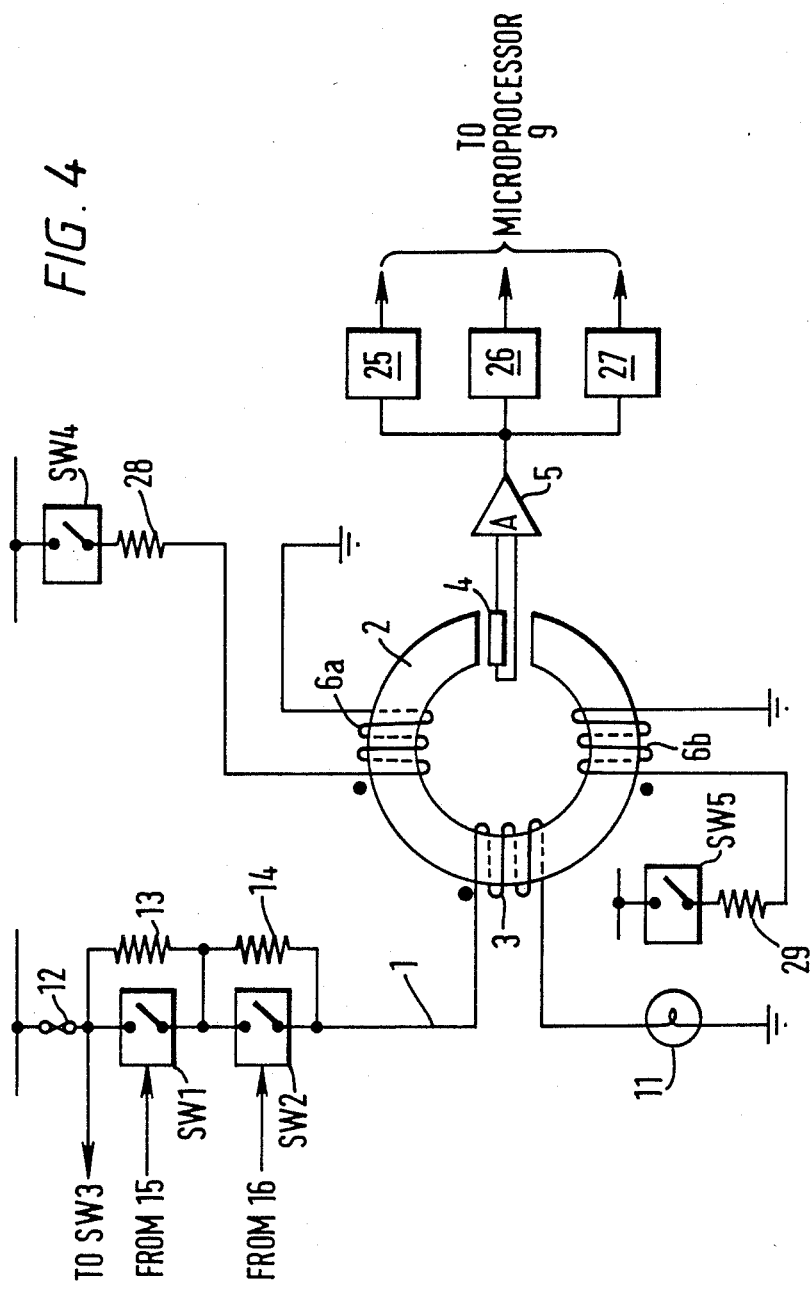
FIG. 4 is a diagram of a modification which can be made to FIG. 3.

If the microprocessor 9 receives an output signal from the converter 21 which indicates that there is a fault condition somewhere in the overall arrangement, then a direct current output is provided on a line 23 to an opto-isolator circuit 24 which provides an output to close a switch SW3, as a result of which a short-circuit is placed across the voltage supply and the fuse 12 is blown to isolate the filament of lamp 11 for safety purposes With reference to FIG. 4 there will now be described an alternative to the arrangement shown in FIG. 3 whereby tests may be carried out to establish whether: means for detection of the current flowing when the filament of the lamp 11 is to be energised (the "hot filament" current) is operating correctly; whether means for detection of the existence of a fleeting or intermittent current when there should not be a current through the filament is operating correctly; and whether means for detection of the low current through the filament when each of the switches SW1 and SW2 is open (the "cold filament" current) is operating correctly. The arrangement of FIG. 3 is altered as shown in FIG. 4. More particularly, the circuit 20 and detector 21 are replaced by three detectors 25, 26 and 27 (which could be Schmitt trigger operational-amplifiers). The detector 25 is adapted to trigger if the output of amplifier 5 is indicative of a "hot filament" current; the detector 26 is adapted to trigger if the output of amplifier 5 is indicative of a "cold filament" current; and the detector 27 is adapted to trigger if the output of the amplifier 5 is indicative of a fleeting or intermittent current. There are two test windings 6a and 6b on the core 2, wound as shown, the winding 6a being energised by closure of a switch SW4 and the winding 6b being energised by closure of a switch SW5. Reference numerals 28 and 29 denote low resistance proof resistors. As regards the detector 25, this is set to trigger if the current through the filament of lamp 11 is above a threshold slightly less than the "hot filament" current. Should the current decrease too much, then the output of detector 25 will go "high". To test the detector 25, the switch SW4 is closed to allow current to flow through the winding 6a, which is wound so that it produces a flux that opposes that created by the filament current This reduces the flux in the transducer 4 and causes the detector 25 to change state. If it does not change state, then it is known that it is faulty It is to be noted that the lamp brightness will not diminish during this test since the test current through the winding 6a is a direct current.

When the lamp 11 is expected to be off, it is necessary to make frequent checks to ensure that it *is* off. Should a fleeting or intermittent current through its filament occur, then the current causes the threshold of the detector 27 to be exceeded, so that its output goes "high". To test the detector 27, the switch SW5 is closed to allow current to flow in the winding 6b. This current is set to a level which produces enough flux to cause the detector 27 to be triggered. If it does not trigger in this event, then it is known that it is faulty. During the testing of the detector 27, the filament of the lamp 11 should not be receiving any current.

To test the detector 26, with switches SW1 and SW2 open and the resistors 13 and 14 allowing the "cold filament" current to pass through the filament of the lamp 11, the switch SW4 is closed to allow a current to flow through the winding 6a whose flux opposes that of the winding 3. This means that, if the detector 26 is operating correctly it should trigger and its output go "high", as if the "cold filament" current had dropped If it does not do so, then it is known that it is faulty.

Incidentally, should either of switches SW1 and SW2 fail to open when required, then the current allowed to flow by resistor 13 and 14 will result in the detector 27 being triggered.

Instead of using three detectors 25, 26 and 27, they could be replaced by a single analogue to digital converter whose output is connected to the microprocessor.

The above testing operations by appropriate closure of switch SW4 or SW5 under a certain condition may be effected under the control of the microprocessor 9.

We claim:
1. A circuit arrangement comprising:
(a) a load;
(b) supply means for supplying current to said load via a current path;
(c) a microprocessor connected for controlling the supply of current from said supply means;
(d) means for detecting said current, said detecting means comprising:
  (i) a core of magnetizable material;
  (ii) a winding coupled inductively with said core, said winding being included in said current path; and
  (iii) transducing means for sensing magnetic flux in said core, said transducing means being coupled with said microprocessor for the supply to said microprocessor of an indication being dependent on the magnitude of said current;

the circuit arrangement further including testing means for testing the condition of said detecting means, said testing means comprising:

(e) a further winding coupled inductively with said core; and (f) further supply means, for supplying current to said further winding, said transducing means also sensing magnetic flux in said core due to current in said further winding when said further supply means supplies such current so that said indication supplied to said microprocessor is then dependent on the condition of said detecting means.

2. A circuit arrangement according to claim 1, wherein the said core forms a closed magnetic circuit with an air gap.

3. A circuit arrangement according to claim 1, wherein the said core is in the shape of a toroid.

4. A circuit arrangement according to claim 2, wherein the said transducing means is located in the said gap.

5. A circuit arrangement according to claim 1, wherein the said transducing means comprises a Hall effect transducer.

* * * * *